United States Patent
Müller et al.

(10) Patent No.: US 10,466,278 B2
(45) Date of Patent: Nov. 5, 2019

(54) SPUN HIGHLY-BIREFRINGENT FIBER FOR CURRENT SENSING WITH INHERENT INSENSITIVITY TO TEMPERATURE

(71) Applicant: ABB Schweiz AG, Baden (CH)

(72) Inventors: Georg Müller, Glattpark (CH); Klaus Bohnert, Oberrohrdorf (CH); Andreas Frank, Zürich (CH); Yang Lin, Widen (CH)

(73) Assignee: ABB Schweiz AG, Baden (CH)

( * ) Notice: Subject to any disclaimer, the term of this patent is extended or adjusted under 35 U.S.C. 154(b) by 54 days.

(21) Appl. No.: 15/650,361

(22) Filed: Jul. 14, 2017

(65) Prior Publication Data
US 2017/0315158 A1   Nov. 2, 2017

Related U.S. Application Data

(63) Continuation of application No. PCT/EP2015/050528, filed on Jan. 14, 2015.

(51) Int. Cl.
*G01R 15/24* (2006.01)
*G02B 6/02* (2006.01)
*G02B 6/10* (2006.01)

(52) U.S. Cl.
CPC ....... *G01R 15/246* (2013.01); *G02B 6/02333* (2013.01); *G02B 6/02347* (2013.01); *G02B 6/105* (2013.01)

(58) Field of Classification Search
CPC .......... G01R 15/246; G01R 15/247; G01R 33/0322; G01R 15/245; G01R 19/32; G01R 15/142; G01R 19/0092; G01R 1/071; G01R 35/005; G01R 19/2513; G01R 1/00; G01R 31/025; G01R 33/032; G01R 29/0842; G01R 15/241; G01R 19/00; G01R 1/22; G01R 33/287; G01R 35/00; G01R 3/00;
(Continued)

(56) References Cited

U.S. PATENT DOCUMENTS

| 7,692,420 | B2 * | 4/2010 | Bohnert | ............... | G01R 15/246 324/96 |
| 9,581,622 | B2 * | 2/2017 | Mueller | ............... | G01R 15/246 |

(Continued)

FOREIGN PATENT DOCUMENTS

| EP | 2682765 A1 | 8/2014 |
| RU | 2358268 C2 | 6/2009 |

(Continued)

OTHER PUBLICATIONS

European Patent Office, International Search Report and Written Opinion issued in corresponding Application No. PCT/EP2015/050528, dated Sep. 15, 2015, 11 pp.
(Continued)

*Primary Examiner* — Vinh P Nguyen
(74) *Attorney, Agent, or Firm* — Taft Stettinius & Hollister LLP; J. Bruce Schelkopf

(57) ABSTRACT

It is proposed to use a spun birefringent fiber for a current sensor or magnetic field sensor. The fiber has a birefringence that increases with temperature. In this case, the temperature dependence of the fiber's sensitivity to magnetic fields counteracts the temperature dependence of the fiber's Verdet constant, which allows to design current and field sensors that have reduced temperature dependence.

21 Claims, 2 Drawing Sheets

(58) Field of Classification Search
CPC .... G01R 15/24; G02B 6/02033; G02B 6/105;
G02B 6/3502; G02B 27/28; G02B 5/30;
G02B 6/00; G02B 6/0008; G02B 6/02;
G02B 6/02109; G02B 6/02347; G02B
6/036; G02B 6/04; G02B 6/274; G02B
6/29343; G02B 6/0239; G01K 11/32;
G01K 11/00; G01K 11/3206; G01N 21/21
See application file for complete search history.

(56) References Cited

U.S. PATENT DOCUMENTS 9,632,114 B2 * 4/2017 Chen ................... G01R 15/247
2016/0033556 A1 2/2016 Mueller et al.

FOREIGN PATENT DOCUMENTS

| RU | 108633 U1 | 9/2011 |
| RU | 2451941 C1 | 5/2012 |
| RU | 130718 U1 | 7/2013 |
| WO | 2007121592 A1 | 11/2007 |
| WO | 2014154299 A1 | 10/2014 |

OTHER PUBLICATIONS

European Patent Office, International Preliminary Report on Patentability issued in corresponding Application No. PCT/EP2015/050528, dated Feb. 6, 2017, 14 pp.

Bohnert et al., "Temperature and Vibration Insensitive Fiber-Optic Current Sensor," Journal of Lightwave Technology, vol. 20, No. 2, Feb. 2002, pp. 267-276.

Clarke, "Temperature-stable spun elliptical-core optical-fiber current transducer," Optics Letters, vol. 18, No. 2, Jan. 15, 1993, pp. 158-160.

Laming et al., "Electric Current Sensors Employing Spun Highly Birefringent Optical Fibers," Journal of Lightwave Technology, vol. 7, No. 12, Dec. 1989, pp. 2084-2094.

Martynkien et al., "Modeling and measurement of temperature sensitivity in birefringent photonic crystal holey fibers," Applied Optics, vol. 44, No. 36, Dec. 20, 2005, pp. 7780-7788.

Michie et al., "Spun elliptically birefringent photonic crystal fibre," Optics Express, vol. 15, No. 4, Feb. 19, 2007, pp. 1811-1816.

Michie et al., "Spun elliptically birefringent photonic crystal fibre for current sensing," Meas. Sci. Tehcnol., vol. 18, 2007, pp. 3070-3074.

Noda et al., "Polarization-Maintaining Fibers and Their Applications," Journal of Lightwave Technology, Vo. LT-4, No. 8, Aug. 1986, pp, 1071-1089.

Ourmazd et al., "Thermal properties of highly birefringent optical fibers and preforms," Applied Optics, vol. 22, No. 15, Aug. 1, 1983, pp. 2374-2379.

Qian et al., "Spun linear birefringence fibres and their sensing mechanism in current sensors with temperature compensation," IEE Proc.-Optoelectron., vol. 141, No. 6, Dec. 1994; pp. 373-380.

Ubranczyk et al., "Dispersion effects in elliptical-core highly birefringent fibers," Applied Optics, vol. 40, No. 12, Apr. 20, 2001, pp. 1911-1920.

Williams et al., "Temperature dependence of the Verdet constant in several diamagnetic glasses," Applied Optics, vol. 30, No. 10, Apr. 1, 1991, pp. 1176-1178.

"Optical Glass," Schott North America, Data Sheets, Product Brochure, 125 pp.

Russian Search Report dated Aug. 2, 2018 from corresponding Russian Publication No. 2017128476; 2 pgs.

* cited by examiner

SPUN HIGHLY-BIREFRINGENT FIBER FOR CURRENT SENSING WITH INHERENT INSENSITIVITY TO TEMPERATURE

TECHNICAL FIELD

The invention relates to a spun birefringent fiber and a current sensor comprising such a fiber as well as to a use of such a fiber for the measurement of current or magnetic field.

BACKGROUND ART

Fiber-optic current sensors are commonly based on the magneto-optic Faraday effect in an optical sensing fiber wound around the current conductor. Care has to be taken in the packaging of the sensing fiber so that mechanical stress does not obstruct the current measurement with the required accuracy via elasto-optic coupling. Typical accuracy requirements in electric power transmission systems are signal stabilities within ±0.2% or even ±0.1% over a temperature range, e.g. from −40° C. up to 85° C. There are essentially two types of sensing fiber used for fiber-optic current sensors;

(i) Low-birefringent sensing fiber ideally shows no intrinsic linear birefringence and therefore is fully sensitive to the magneto-optic Farady effect. However, bending the fiber to a sensing coil and hardening of the fiber coating at low temperatures introduce mechanical stress that can significantly influence the current measurement. Current sensors employing low-birefringent sensing fibers in some prior art accordingly comprise a stripped sensing fiber, i.e. an optical fiber without coating and residing is an oil-filled glass capillary.

(ii) In addition, prior art used spun highly birefringent sensing fiber [1]. Such a fiber is elliptically birefringent, which is achieved by local linear birefringence with principal axes that rotate along the fiber. Such fibers are typically produced by rotating the fiber preform during the drawing process. The local linear birefringence can be achieved by same fiber designs that are used for linear birefringent and thus polarization-maintaining fiber [2]. Such designs can be based on stress-induced birefringence such as panda, bow-tie [1], and elliptical cladding structures, geometrically induced birefringence such as in microstructured fibers [3], or combinations of stress and geometrically induced birefringence such as in elliptical core fibers [4]. The rotating intrinsic birefringence of a spun highly birefringent fiber basically makes the fiber less sensitive to external mechanical stress while the fiber still shows decent sensitivity to the magneto-optic Faraday effect. Accordingly, this fiber enables simplified fiber packaging compared to low-birefringent sensing fiber.

However, the temperature dependence of the spun fiber's birefringence generally adds additional temperature dependent contributions to the overall signal. First, there are cacillatory signal instabilities as a function of temperature, resulting from interference of sets of light waves with temperature dependent phase difference [1]. Prior are uses several remedies to remove this oscillartory behaviour. Examples are the usage of a sufficiently long sensing fiber in connection with a broadband light source [1], then injection of pure eigenmodes into the sensing fiber [4], the use of a sensing fiber composed of two spun highly-birefringent fibers with opposite sense of spinning [10], and the use of a spun highly-birefringent fiber with small temperature dependent birefringence [3].

Secondly, the spun fiber's birefringence reduces the overall sensitivity of the current sensor compared to the corresponding sensor employing low-birefringent sensing fiber [1]. A change of birefringence of the spun fiber with temperature accordingly changes also the sensor's sensitivity and correspondingly the sensor's scale factor in many fiber-optic current sensor configurations [1]. This results typically in a mostly linear scale factor variation with temperature. Spun highly-birefringent fibers of prior art show a negative (or vanishing [3]) temperature dependence of their birefringence, i.e. their birefringence decreases with temperature and accordingly increases the scale factor of a current sensor employing this fiber. This linear or close to linear temperature dependent contribution is of the same sign and typically also of the same order of magnitude as temperature variation of the Faraday effect, which amounts to around 0.7%/100° C. for fused silica fiber [5]. Accordingly, without further means for temperature compensation, fiber-optic current sensors employing highly-birefringent spun fiber can have in total a temperature dependence that can reach up to a few percent/100° C.

DISCLOSURE OF THE INVENTION

The problem to be solved by the present invention is therefore to provide a fiber and sensor of the type mentioned above with reduced temperature sensitivity.

This problem is solved by the fiber and the sensor of the independent claims.

Accordingly, the fiber in a spun birefringent fiber having a local linear birefringence B↑0. In this context, the term "local linear birefringence" refers to the birefringence that an equivalent unspun fiber would have. Preferably, (but not necessarily) the magnitude of the local linear birefringence remains constant along the fiber.

The fiber is such that the relative temperature dependence $(1/B)*dB/dT$ of the birefringence is larger than zero for at least one wavelength $\lambda$ and the least one temperature T between −60° C. and 120° C.

In other words, the (absolute value of) the birefringence increases as temperature increases, for at least one temperature regime between −60° C. and 120° C.

As discussed below, such a positive relative temperature dependence leads to an inherent at least partial compensation of the temperature-dependence of the Verdet constant V of the fiber material.

Advantageously, at said temperature T and wavelength $\lambda$, the fiber has a local linear birefringence of at least $1.3 \cdot 10^{-5}$ or even at least $2.6 \cdot 10^{-5}$.

Further, again at least at said wavelength $\lambda$ and said temperature T, the spin rate a of the fiber (i.e. the angular rotation in radians over length) is advantageously such that $x = 2 \cdot \alpha/\eta$ is between 1 and 10, wherein $\eta$ is the local linear birefringent phase shift per unit length given by $\eta = 2\pi \cdot B/\lambda$. As can be seen from Eq. (2) below, a too low value of parameter x (i.e. a spin rate that is too low or a birefringence that is too high) leads to a very small value of the spun fiber scale factor K, i.e. sensor sensitivity decreases. On the other hand, if parameter x is larger than 10, the fiber behaves more and more like a low-birefringent fiber and loses its insesitivity to mechanical stress.

As described below, one advantageous class of fibers that can have a positive relative temperature dependence of the birefringence are microstructured fibers. These are fibers that have microstructures embedded therein, in particular cavities or recesses running along the fiber that affect the effective refractive index. In particular, the fiber can comprise cavities, in particular air-filled cavities, which extend along the fiber.

The at least one wavelength λ where the relative temperature dependence of the birefringence is positive is advantageously in a range between 400 nm and 2000 nm, in particular between 1000 nm and 1700 nm, in order to carry out measurements using conventional wavelengths.

Further and advantageously, the fiber is a single-mode fiber, at least at said at least one wavelength λ. In this context, a fiber is understood to be a single-mode fiber, if it carries only the fundamental (spatial) fiber mode which can consist of two orthogonally polarized sub-modes. This makes the fiber suitable for most fiber-based measurement methods.

In yet another advantageous embodiment, the relative temperature dependence (1/B)·dB/dT of said birefringence is larger than zero for all temperatures between −40° C. and 85° C., which allows to carry out temperature-compensated measurements in nearly all naturally occurring situations.

The invention also relates to a current sensor that comprises:
 a birefringent spun fiber as described above,
 a light source generating light at said at least one wavelength λ, and
 a detection unit structured and adapted to measure the phase shift $\emptyset_\phi$ between two polarization modes having passed through the fiber.

For the reasons above, the fiber described here is particularly suited for measuring an electrical current or for measuring a magnetic field. Hence, the invention also relates to such a use of the fiber.

Other advantageous embodiments are listed in the dependent claims of claim combinations as well as in the description below together with the drawings.

BRIEF DESCRIPTION OF THE DRAWINGS

The invention will be better understood and objects other than those set forth above will become apparent from the following detailed description thereof. Such description refers to the annexed drawings, wherein.

MODES FOR CARRYING OUT THE INVENTION

The new type of spun highly-birefringent sensing fiber described here can be used in fiber-optic current sensors of magnetic field sensors of different kinds, such as polarimetric sensors [1], [10], Sagnac-interferometer based current sensors [4], and in-line interferometric current sensors with phase-modulation-based or passive interrogation schemes.

Figure 1:
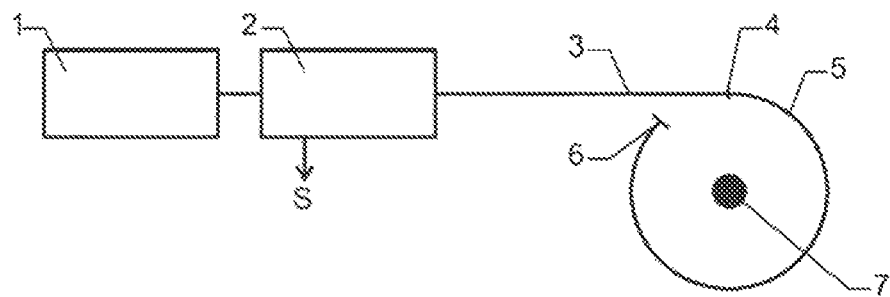
FIG. 1 shows a schematic diagram of a current sensor.

FIG. 1 shows a fiber-optic current sensor e.g. as described in [5] or [13]. It comprises a light source 1 generating light of at least one wavelength λ. Two polarization modes of the light pass a detection unit 2 and then enter a polarization maintaining fiber 3 and a coupler 4 to arrive at a sensing fiber 5. In sensing fiber 5, the polarization modes propagate to a mirror 6, where they are reflected in order to return through sensing fiber 5 and polarization maintaining fiber 3 into detection unit 2. In detection unit 2, the phase shift $\emptyset_\phi$ that the two polarization modes have obtained in their trip through sensing fiber 5 is measured.

Sensing fiber 5 is wound at least once around a current conductor 7, with a current-dependent magnetic field around it. Sensing fiber 5 consists of a magneto-optic material (typically fused silica) with non-zero Verdet constant V.

The skilled person is aware of various designs of such fiber-optic current sensors. The sensors can work in reflection, as shown in FIG. 1, i.e. the light is reflected from a mirror at the end of the sensing fiber, or they can work in transmission, i.e. the light passes the fiber only once and is analysed after exiting from the end of the fiber.

In the present invention, sensing fiber 5 is a birefringent spun fiber. Advantageously, sensing fiber 5 is a highly-birefringent spun fiber, i.e. a fiber having a linear birefringence B=n1-n2 of at least $1.3 \cdot 10^{-5}$ of even at least $2.6 \cdot 10^{-5}$.

In fiber-optic current sensors employing spun highly-birefringent fiber of prior art [1], [10], the current (or, equivalently, the magnetic field to be measured) induces a phase shift $\emptyset_\phi$ between two Eigenmodes of the fiber. This phase shift $\emptyset_\phi$ is typically linearly dependent on the current I to be measured. In general $$\emptyset_\phi \sim K \cdot V \cdot I, \qquad (1)$$

with the tilde (~) expressing proportionality and K being a spun fiber scale factor, which is 1 for a fiber free of linear birefringence, but K<1 for a spun birefringent fiber. V is the Verdet constant of the fiber and I the current to be measured running through the conductor 7.

For a variety of current sensors employing spun birefringent fiber, the spun fiber scale factor K takes the form $$K = (2 + x^{-2})^{-2}, \qquad (2)$$

with x being defined as x=2α/η, wherein a is the spin rate (i.e. the angular rotation in radians over length) and η is the differential modal phase shift per unit length of the orthogonal polarization modes of an equivalent unspun, i.e. linearly birefringent fiber. The exponent a is positive (a≥0), e.g. a=2 as in Ref. [1].

The term K leads to an extra temperature dependence of the sensor signal S ($\emptyset_\phi$), in addition to the temperature dependence of the Faraday effect (Verdet constant v), which is known to be positive in diamagnetic glasses such as fused silica. The relative temperature dependence of the scale factor K is given by $$(1/K) \cdot dK/dT = -2a \cdot x^{-2} \cdot (1+x^{-2})^{-1} \cdot (1/\eta) \cdot (d\eta/dT) \qquad (3)$$

Note that thermal elongation of the fiber equally changes the spin rate and the birefringent phase shift term η and therefore leaves x and K unchanged.

According to Eq. (3), the spun fiber contribution to the temperature dependence of the current sensor can be tuned by tuning the quantity B. The local linear birefringence in a spun fiber, i.e. the difference of refractive indices for two orthogonal linear polarization states, is given by B=n1-n2.

The linear phase shift per unit length amounts to $\eta=2\pi\cdot B/\lambda$. The temperature dependence of n is given by $(1/n)\cdot dn/dT=(1/B)\cdot dB/dT$.

From Eq. (1) it follows that the phase shift per current, $\varnothing_\varphi/1$, is proportional to the product of K·V. The relative temperature-dependence of $\varnothing_\varphi/1$ and therefore the temperature dependence of the sensor signal S ($\varnothing_\varphi$) is given by the relative temperature dependences of the spun fiber scale factor K and the Verdet constant V. In particular, it follows from Eq. (1) that $$(1/\varnothing_\varphi)\cdot d(A<p/I)/dT=[(1/K)\cdot dK/dT+(1/V)\cdot dV/dT] \qquad (4)$$

Hence, in order to reduce the temperature dependence, the relative temperature dependence of the scale factor K, i.e. $(1/K)\cdot dK/dT$, should have opposite sign and similar magnitude as the relative temperature dependence of the Verdet constant V, i.e. $(1/V)\cdot dV/dT$. In that case, the absolute value of the relative temperature dependence of K·V is smaller than the absolute value of the relative temperature dependence of V alone, i.e.

$$|(1/K)\cdot dK/dT+(1/V)\cdot dV/dT|<|(1/V)\cdot dV/dT|$$

Since $(1/V)\cdot dV/dT$ is positive, $(1/K)\cdot dK/dT$ should be negative. Hence, it follows from Eq. (3) that $(1/n)^*dn/dT=(1/B)^*dB/dT$ should be positive.

In some types of spun fiber, the local birefringence is achieved by stress bodies (e.g. panda or bow-tie type stress regions) in the fiber cladding. This stress results from the different temperature expansion coefficients of the undoped fiber cladding regions and the typically E^C^-doped stress bodies, i.e. a permanent stress field is generated in the fiber while cooling down from the drawing temperature. With increasing temperature, stress is released. Accordingly, the birefringence of such types of fibers typically decreases with increasing temperature (see e.g. [7] for the case of unspun linear birefringent fiber), i.e. a spun fiber with birefringence induced by stress bodies in the cladding typically adds, according to Eqs. (3) and (4), a positive contribution to the temperature dependence of the signal 3, in addition to the positive contribution of the Verdet constant.

The temperature dependence of the birefringence of unspun linear birefringent fiber has been studied intensively. Especially, the dominance of the negative temperature dependence of stress-induced birefringence was shown [7], [8].

In elliptical core fibers, the birefringence results from the elliptical shape of the core, and the temperature dependence is determined by the variation of core and cladding refractive indices with temperature as well as from relaxation of residual stress. Commonly, the latter typically dominates [3]. Correspondingly, spun elliptical core fibers also show a decrease of their linear birefringence with temperature and thus also add a positive contribution to the temperature dependence to the sensor signal [Eqs. (3) and (4)].

In contrast, it is well known that in pure silica, micro-structured linear birefringent fibers stress-induced birefringence, which typically shows a negative temperature dependence, is strongly reduced and, accordingly, the birefringence is mostly due to the particular fiber geometry. The temperature dependence can then be significantly smaller than in fibers with stress-induced birefringence. In Ref. 11, micro-structured spun highly birefringent sensing fiber was used in order to minimize the temperature dependence, i.e. the term $|(1/n)^*dn/dT)|$, compared to spun fiber with stress-induced birefringence.

Hence, a micro-structured spun highly birefringent fiber can be used for current sensing designed such that the term $(1/K)^*dK/DT$ becomes negative (i.e. $(1/n)^*dn/dT$) and $(1/B)^*dB/dT$) are positive) and balances at least partially the positive temperature dependence of the Verdet constant V. As a result, the detected magneto-optic phase shift (sensor signal) becomes less dependent on temperature.

A transfer of the detailed understanding of the linear birefringence in unspun microstructured fiber [8] helps to engineer the temperature dependence of the birefringence of spun micro-structured fiber to achieve this goal.

Figure 2:
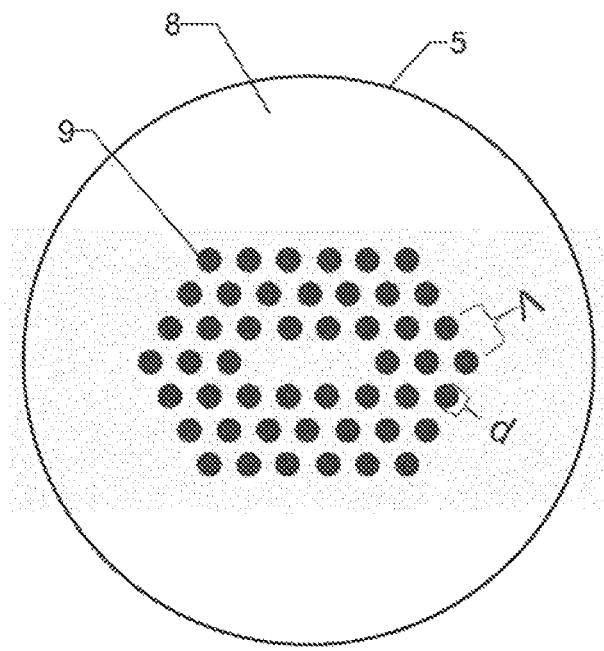
FIG. 2 shows the design of a microstructured fused silica fiber with positive temperature dependence of the birefringence for Λ=1 nm and d=0.4 nm (with the black dots representing air holes while the white area are representing fused silica)

FIG. 2 shows an embodiment of a holey sensing fiber 5 comprising a glass body 8 with longitudinally extending cavities 9. Further possible fiber designs are given in [9].

The linear birefringence B of a given spun holey fiber design is a function of the wavelength $\lambda$, the refractive indices $n_{glass}$ of the glass and $k_{ole}$ of the cavity filling material (typically air), respectively, the cavity pitch A and the cavity diameter d: B ($\lambda$, $n_{glass}$, $k_{ole}$, A, d/A). The temperature dependence of the linear birefringence in the spun fiber is:

$$dB/dn_{glass}\times dn_{glass}/dT+dB/dn_{hole}\times dn_{hole}/dT+dB/dA\times (\Upsilon glass\, A), \qquad (4)$$

where Yglass is the thermal expansion coefficient of the glass. The thermo-optic coefficient of air "air/dT" $-10^{-6}$ $k^{-1}$ is typically small so that the first term in Eq. (4) dominates the other two [9]. The sign of the first term is determined by the signs of the terms $dB/dn_{glass}$ and $dn_{glass}/dT$. The quantity $dB/dn_{glass}$ depends on the geometrical design of the fiber. The quantity $dn_{glass}/dT$ strongly depends of the type of glass used, e.g. dn $SiO^2/dT\sim 10^{-8}$ $K^{-1}$ for fused silica [9] and the majority of available optical glasses shown $dn_{glass}/dT<0$. There is also a range of commercial optical glasses with $dn_{glass}/dT<0$ such as N-FK5, N-FK51A, N-PK52A, P-PK53, N-PSK53A, N-LAK12, N-SE6, N-SF10, N-SF14, N-SF57, N-SF66, P-SF8 [12].

Hence, in the embodiment, the fibers can exhibit a combination of values $dB/dn_{glass}<0$ and $dn_{glass}/dT<0$, while in another embodiment, the fiber can exhibit a combination of values $dB/dn_{glass}<0$ and $dn_{glass}/dT>0$. In both cases, it follows from Eq. (4) that dB/dT will be positive.

The temperature dependence of the linear birefringence in unspun holey fibers was studied in detail showing that, by designing the glass composition and/or the structure of the fiber, a positive, zero, or negative temperature dependence of the birefringence in the unspun fiber can be achieved [9].

It was shown in Ref. [9] that the birefringence B as function of $n_{glass}$ attains for a design as in FIG. 2 a local maximum at a given $n_{glass}$ max. Accordingly, the sign of the first term in Eq. (4) can be positive (for $n_{glass}<n_{glass}^{max}$ and $d_{glass}/dT>0$ or for $n_{glass}>n_{glass}$ max and $dn_{glass}/dT<0$, or negative (for $n_{glass}>n_{glass}$ max and $dn_{glass}/dT>0$ or for $n_{glass}<n_{glass}^{max}$ and $dn_{glass}/dT<0$).

Figure 3:
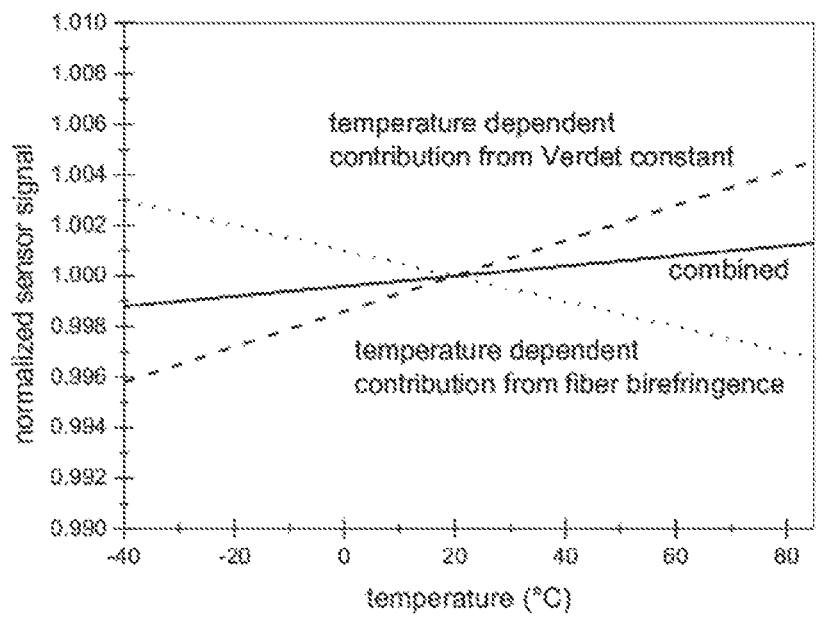
FIG. 3 shows the temperature dependent contributions to the sensor signal stemming from Verdet constant and fiber birefringence and overall temperature dependence of a sensor signal for the example given in FIG. 2.

The value for $n_{glass}^{max}$ where B attains a maximum depends on the fiber structure, whereas $n_{glass}$ can be tuned by the glass composition. Accordingly, dB/dT can be designed to be positive by proper choice of the fiber geometry as well as of the glass composition. The fiber structure given in FIG. 2 shows a positive temperature dependence of the birefringence over a wide wavelength range 0.5 nm-1.5 nm when using fused silica; for example, at a wavelength k=1.3 nm, this structure shows a relative temperature dependence of roughly $(1/n)^*dn/dT)\approx +0.4\times 10^{-4\circ}$ $C.^{-1}$ and $\eta\neq 4.8$ $mm^{-1}$ [9]. Setting the spin rate of the spun fiber to $a=0.75$ $\eta$ results for a=2 in a temperature dependence of the spun fiber current sensor signal [see Eq. (3)] of $(1/K)*dK/DT \approx -1.2 \cdot (1/n) \cdot dn/dT \approx -0.5 \times 10^{-4}$ °$C.^{-1}$, i.e. the temperature dependence of the Verdet constant V ($+0.7 \times 10^{-4}$ °$C.^{-1}$) is compensated to within $\pm 0.1\%$ over 100° C. as illustrated in FIG. 3.

Advantageously, the temperature dependence of the birefringence is such that $(1/B) \cdot dB/dT$ is between $0.1 \cdot 10^{-4}$/° C. and $2 \cdot 10^{-3}$/° C. or between $0.05 \cdot 10^{-4}$/° C. and $5 \cdot 10^{-3}$/° C., in which case the typical temperature dependence of the Verdet constant is compensated most effectively.

Further embodiments for a spun highly-birefringent fiber with the desired property of $(1/B)*dB/dT>0$ comprise—as described in the following—(i) spun fibers with two orthogonal contributions to the total local linear birefringence and (ii) spun elliptical core fibers with negligible birefringence contribution from mechanical stress.

(i) The birefringence B of this embodiment of a fiber is generated by a superposition of two orthogonal birefringence contributions B1 and B2. In the designated temperature range, the contribution B1 exceeds the contribution B2 so that fast and slow axes of the overall birefringence B are aligned with the birefringence contribution B1 and amounts to B=B1-B2. The temperature dependence of the smaller birefringence contribution dB2/dT is negative, e.g. because it originates from stress induced birefringence, and is chosen such that it is smaller than dB1/dT, i.e. dB2/dT<dB1/dT, in the designated temperature range. The temperature dependence of the overall birefringence accordingly calculated to: dB/dT=dB1/dT-dB2/dT>0. The quantities B1, B2, dB1/dT, dB2/dT can properly be chosen to design B and dB/dT in the designated temperature range.

Figure 4:
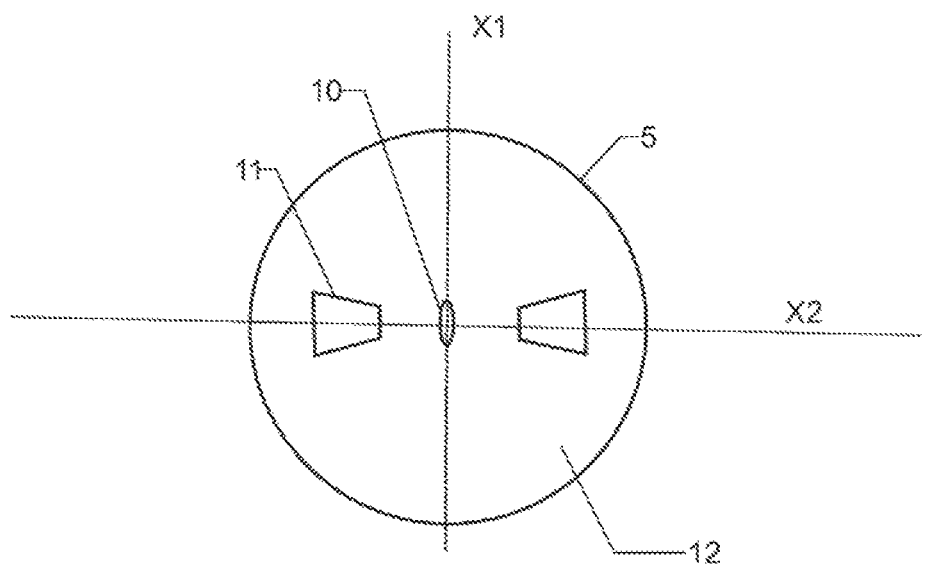
FIG. 4 shows a schematic cross section of a fiber with two orthogonal contributions to the total linear birefringence—the slow axis of the birefringence from the bow-tie structure is along the horizontal line x2, the slow axis of the birefringence from the elliptical core along the vertical line x1.

FIG. 4 shows an exemplary cross section of such a fiber. It comprises a core 10 enclosed by a cladding 12, with core 10 having higher refractive index than cladding 12. Typically, core 10 is formed by a region that has a higher dopant level than cladding 12.

Core 10 has an elongate axis direction XI, which designates the direction of the largest radial extension of core 10. In a direction X2 perpendicular to elongate axis direction XI, two stress bodies 11 formed e.g. by a bow-tie structure are embedded in cladding 12. The stress bodies can be formed by regions having higher dopant level than the rest of cladding 12. No such stress bodies are present along elongate axis direction XI. In this context, the term "stress body" designates a region that, at the at least one temperature T, gives rise to mechanical stress within cladding 12.

In this embodiment, birefringences B1 is given by elliptical core 10 and B2 originates from the stress bodies, i.e. from the bow-tie structure 11. Here, both terms dB1/dT and dB2/dT are typically negative, but the absolute value of dB2/dT can be, as an example, five times larger than the absolute value of dB1/dT, so that the total birefringence B increases with increasing temperature. The two birefringence contributions can in general be introduced by all design means mentioned above, i.e. elliptical cladding, elliptical core, microstructuring, stress bodies in the fiber cladding (e.g. panda or bow-tie).

(ii) The interplay of the stress and geometry induced birefringence in unspun elliptical core fibers is well described in prior art [8]. While typically the stress-induced contribution dominates and accordingly the overall birefringence shows a negative dependence on temperature, i.e. dB/dT<0, there are parameter ranges where the stress-induced contribution $B_{stress}$ becomes negligible (see FIG. 5 in Ref. [8]). The temperature dependence of the geometry induced contribution $B_{geo}$ depends on the temperature dependence of the refractive index difference between core and cladding, $d(n_{core}-n_{cladding})/dT$, and in case of the most common glass composition for fibers (cladding SiO2, core SiO2/GeO2) the geometry induced birefringence is positive (see FIG. 6 in Ref. [8]). Accordingly, spinning the preform of an accordingly designed elliptical core fiber during the drawing process results in a spun fiber with dB/dT>0.

While there are shown and described presently preferred embodiments of the invention, it is to be distinctly understood that the invention is not limited thereto but may be otherwise variously embodied and practiced within the scope of the following claims.

REFERENCES

1. R. I. Laming and D. N Payne, "Electric current sensors employing spun highly birefringent optical fibers," Journal of Lightwave Technology 7, 2084-2094 (1989).
2. J. Noda, K. Okamoto, and Y. Sasaki, "Polarization-maintaining fibers and their applications," Journal of Lightwave Technology 4, 1071-1089 (1986).
3. A Michie, J. Canning, I. Bassett, J. Haywood, K. Digweed, M. Aslund, B. Ashton, M. Stevenson, J. Digweed, A. Lau, and D. Scandurra, "Spun elliptically birefringent photonic crystal fibre," Optics Express 15, 1811-1816 (2007).
4. I. G. Clarke, "Temperature-stable spun elliptical-core optical-fiber current transducer," Optics Letters 18, 158-160 (1993).
5. WO 2007/121592
6. P. A. Williams, A. B. Rose, G. W. Day, T. E. Milner, and M. N. Deeter, "Temperature dependence of the Verdet constant in several diamagnetic glasses," Applied Optics 30, 1176-1178 (1991).
7. A. Ourmazd, M. P. Varnham, R. D. Birch, and D. N. Payne, "Thermal properties of highly birefringent optical fibers and preforms," Applied Optics 22, 2374-2379 (1983).
8. W. Urbanczyk, T. Martynkien, and W. J. Bock, "Dispersion Effects in Elliptical-Core Highly Birefringent Fibers," Applied Optics 40, 1911-1920 (2001).
9. T. Martynkien, M. Szpulak, and W. Urbanczyk, "Modeling and measurement of temperature sensitivity in birefringent photonic crystal holey fibers," Applied Optics 44, 7780-7788 (2005).
10. J. R. Zian, Q. Guo, and L. Li, "Spun Linear birefringence fibres and their sensing mechanism in current sensors with temperature compensation," IEE Proc.-Opto-electron, 141, 373-380 (1994).
11. A. Michie, J. Canning, I. Bassett, J. Haywood, K. Digweed, B. Ashton, M. Stevenson, J. Digweed, A. Lau, and D. Scandurra, "Spun elliptically birefringent photonic crystal fibre for current sensing," Measurement Science and Technology 18, 3070 (2007).
12. "Optical Glass-Data Sheets," (Schott North America Inc., 2013).
13. K. Bohnert, P. Gabus, J. Nehring, and H. Brandle, "Temperature and vibration insensitive fiber-optic current sensor," Journal of Lightwave Technology 20, 267-276 (2002).

REFERENCE NUMBERS

1: light source
2: detection unit
3: polarization maintaining fiber
4: polarization converter
5: sensing fiber
6: mirror 7: current conductor
8: glass body
9: cavities
10: elliptical core
11: bow-tie structure
12: cladding
XI, X2: core axis directions

The invention claimed is:

1. A spun birefringent fiber comprising a local linear birefringence B≠0, wherein a relative temperature dependence $(1/B)·dB/dT$ of said birefringence is larger than zero for at least one wavelength λ and for at least one temperature T between −60° C. and 120° C., and this positive relative temperature dependence leads to an inherent at least partial compensation of the temperature-dependence of the Verdet constant V of the spun birefringent fiber.

2. The spun birefringent fiber of claim 1, wherein, at least at said wavelength λ and said temperature T, a spin rate α of said spun birefringent fiber is such that $2·α/η$ is between 1 and 10, wherein η is a birefringent phase shift per unit length associated with the local linear birefringence B and is given by $η = n2\ π*B/λ$.

3. The spun birefringent fiber of claim 1, wherein said spun birefringent fiber is a microstructured fiber, which comprises cavities extending along said spun birefringent fiber.

4. The spun birefringent fiber of claim 3, wherein said cavities are air-filled cavities.

5. The spun birefringent fiber of claim 1, wherein said spun birefringent fiber is of a glass having a refractive index $n_{glass}$ and wherein, at least at said temperature T and wavelength λ,
   (a) $dB/dn_{glass} < 0$ and $dn_{glass}/dT < 0$, or
   (b) $dB/dn_{glass} > 0$ and $dn_{glass}/dT > 0$.

6. The spun birefringent fiber of claim 1, comprising an elliptical core and a cladding, wherein at least at said wavelength and temperature a stress-induced birefringence $B_{stress}$ is smaller than a geometry introduced birefringence $B_{geo}$ such that $|B_{stress}| < |B_{geo}|$.

7. The spun birefringent fiber of claim 1, wherein said local linear birefringence B is composed of two distinct birefringence contributions B1 and B2 having orthogonal slow axes at least at said wavelength and temperature with $|B1| > |B2|$ and $dB2/dT < dB1/dT$.

8. The spun birefringent fiber of claim 7, comprising an elliptical core surrounded by a cladding, wherein said elliptical core has a refractive index larger than said cladding, and wherein at least two stress bodies are located in said cladding along a direction perpendicular to an elongate axis direction of said core, and said stress bodies are formed by regions having a higher dopant level than a rest of said cladding, said birefringence contribution B1 being defined by the elliptical core and said birefringence contribution B2 being defined by the stress bodies.

9. The spun birefringent fiber of claim 1, wherein the temperature dependence of the birefringence is such that $(1/B)·dB/dT$ is between $0.05·10^{-4}/°$ C. and $5·10^{-3}/°$ C.

10. The spun birefringent fiber of claim 1, wherein the temperature dependence of the birefringence is such that $(1/B)·dB/dT$ is between $0.1·10^{-4}/°$ C. and $2·10^{-3}/°$ C.

11. The spun birefringent fiber of claim 1, wherein said spun birefringent fiber is of a diamagnetic glass.

12. The spun birefringent fiber of claim 11, wherein said diamagnetic glass is fused silica.

13. The spun birefringent fiber of claim 1, wherein said at least one wavelength is in a range between 400 nm and 2000 nm.

14. The spun birefringent fiber of claim 1, wherein said at least one wavelength is in a range between 1000 nm and 1700 nm.

15. The spun birefringent fiber of claim 1, wherein said spun birefringent fiber is, at least at said at least one wavelength λ, a single-mode fiber.

16. The spun birefringent fiber of claim 1, wherein said relative temperature dependence $(1/B)·dB/dT$ of said birefringence is larger than zero for all temperatures between −40° C. and 85° C.

17. The spun birefringent fiber of claim 1, wherein at said temperature T and wavelength λ, the spun birefringent fiber has a local linear birefringence of at least $1.3·10^{-5}$.

18. The spun birefringent fiber of claim 1, wherein at said temperature T and wavelength λ, the spun birefringent fiber has a local linear birefringence of at least $2.6·10^{-5}$.

19. The spun birefringent fiber of claim 1, wherein the local linear birefringence $B = n_1 - n_2$ is given by the difference of refractive indices $n_1$, $n_2$ for two orthogonal linear polarization states.

20. A current sensor comprising:
   a spun birefringent fiber of claim 1,
   a light source generating light at said at least one wavelength λ, and
   a detection unit measuring a phase shift Dj between two polarization modes having passed through said spun birefringent fiber.

21. The current sensor of claim 20, wherein said phase shift is given by $$Dj \sim K·V·I,$$

with K being a spun fiber scale factor, V being the Verdet constant and I being the current to be measured, and wherein the absolute value of the relative temperature dependence of K·V is smaller than the absolute value of the relative temperature dependence of V alone according to $$|(1/K)·dK/dT + (1/V)·dV/dT| < |(1/V)·dV/dT|.$$

* * * * *